US009918370B2

(12) United States Patent
Wolk et al.

(10) Patent No.: US 9,918,370 B2
(45) Date of Patent: Mar. 13, 2018

(54) ELECTROLUMINESCENT DEVICES AND METHODS OF MAKING ELECTROLUMINESCENT DEVICES INCLUDING AN OPTICAL SPACER

(71) Applicant: SAMSUNG DISPLAY CO., LTD., Yongin-si, Gyeonggi-do (KR)

(72) Inventors: Martin B. Wolk, Woodbury, MN (US); Robert L. Brott, Woodbury, MN (US); Thomas R. Hoffend, Jr., Woodbury, MN (US)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/034,322

(22) Filed: Sep. 23, 2013

(65) Prior Publication Data

US 2014/0021858 A1 Jan. 23, 2014

Related U.S. Application Data

(63) Continuation of application No. 11/024,202, filed on Dec. 28, 2004, now Pat. No. 8,569,948.

(51) Int. Cl.
| | | |
|---|---|---|
| *H05B 33/22* | (2006.01) | |
| *H01L 27/32* | (2006.01) | |
| *H01L 51/52* | (2006.01) | |
| *H01L 33/46* | (2010.01) | |

(52) U.S. Cl.
CPC .......... *H05B 33/22* (2013.01); *H01L 27/322* (2013.01); *H01L 27/3211* (2013.01); *H01L 51/5265* (2013.01); *H01L 33/465* (2013.01); *H01L 2924/0002* (2013.01)

(58) Field of Classification Search
CPC ...... H05B 33/22; H01L 5/5265; H01L 33/465; H01L 27/322; H01L 27/3211
USPC ...... 313/498–512; 315/169.3; 345/36, 45, 76
See application file for complete search history.

(56) References Cited

U.S. PATENT DOCUMENTS

| | | | |
|---|---|---|---|
| 4,252,671 | A | 2/1981 | Smith |
| 4,897,319 | A | 1/1990 | Sun |
| 5,166,024 | A | 11/1992 | Bugner et al. |
| 5,171,650 | A | 12/1992 | Ellis et al. |
| 5,256,506 | A | 10/1993 | Ellis et al. |
| 5,278,023 | A | 1/1994 | Bills et al. |

(Continued)

FOREIGN PATENT DOCUMENTS

| | | |
|---|---|---|
| DE | 19623881 | 11/1997 |
| EP | 0 616 488 | 5/1998 |

(Continued)

OTHER PUBLICATIONS

KIPO Office action dated Feb. 10, 2012, for corresponding Korean Patent Application No. 10-2007-7017519, 5 pages.

(Continued)

*Primary Examiner* — Christopher Raabe
(74) *Attorney, Agent, or Firm* — Lewis Roca Rothgerber Christie LLP

(57) ABSTRACT

An electroluminescent device and a method of making an electroluminescent device that includes one or more optical spacers are disclosed. In one embodiment, the method includes forming an electroluminescent element on a substrate. The method further includes selectively thermally transferring an optical spacer.

20 Claims, 2 Drawing Sheets

(56) References Cited

U.S. PATENT DOCUMENTS

| | | | |
|---|---|---|---|
| 5,308,737 A | 5/1994 | Bills et al. | |
| 5,351,617 A | 10/1994 | Williams et al. | |
| 5,405,710 A | 4/1995 | Dodabalapur et al. | |
| 5,521,035 A | 5/1996 | Wolk et al. | |
| 5,554,911 A * | 9/1996 | Nakayama | H01L 51/5036 |
| | | | 313/503 |
| 5,621,131 A | 4/1997 | Kreuder et al. | |
| 5,652,600 A | 7/1997 | Khormaei et al. | |
| 5,693,446 A | 12/1997 | Staral et al. | |
| 5,708,130 A | 1/1998 | Woo et al. | |
| 5,725,989 A | 3/1998 | Chang et al. | |
| 5,728,801 A | 3/1998 | Wu et al. | |
| 5,783,115 A | 7/1998 | Bilkadi et al. | |
| 5,840,217 A | 11/1998 | Lupo et al. | |
| 5,869,350 A | 2/1999 | Heeger et al. | |
| 5,900,327 A | 5/1999 | Pei et al. | |
| 5,928,801 A | 7/1999 | Broer et al. | |
| 5,929,194 A | 7/1999 | Woo et al. | |
| 5,998,085 A | 12/1999 | Isberg et al. | |
| 6,030,715 A | 2/2000 | Thompson et al. | |
| 6,057,067 A | 5/2000 | Isberg et al. | |
| 6,111,355 A | 8/2000 | Inoue et al. | |
| 6,114,088 A | 9/2000 | Wolk et al. | |
| 6,117,529 A | 9/2000 | Leising et al. | |
| 6,132,641 A | 10/2000 | Rietz et al. | |
| 6,137,221 A * | 10/2000 | Roitman et al. | 313/504 |
| 6,140,009 A | 10/2000 | Wolk et al. | |
| 6,150,043 A | 11/2000 | Thompson et al. | |
| 6,169,163 B1 | 1/2001 | Woo et al. | |
| 6,181,062 B1 | 1/2001 | Hiraishi et al. | |
| 6,221,543 B1 | 4/2001 | Guehler et al. | |
| 6,228,555 B1 | 5/2001 | Hoffend, Jr. et al. | |
| 6,242,115 B1 | 6/2001 | Thompson et al. | |
| 6,284,425 B1 | 9/2001 | Staral et al. | |
| 6,291,116 B1 | 9/2001 | Wolk et al. | |
| 6,329,058 B1 | 12/2001 | Arney et al. | |
| 6,358,664 B1 | 3/2002 | Nirmal et al. | |
| 6,392,340 B2 | 5/2002 | Yoneda et al. | |
| 6,410,201 B2 | 6/2002 | Wolk et al. | |
| 6,432,526 B1 | 8/2002 | Arney et al. | |
| 6,461,775 B1 | 10/2002 | Pokorny et al. | |
| 6,485,884 B2 | 11/2002 | Wolk et al. | |
| 6,521,035 B1 | 2/2003 | Shiraishi | |
| 6,522,067 B1 | 2/2003 | Graff et al. | |
| 6,552,488 B1 | 4/2003 | Reitman et al. | |
| 6,563,263 B1 | 5/2003 | Kawaguchi et al. | |
| 6,580,214 B2 | 6/2003 | Yoneda et al. | |
| 6,582,876 B2 | 6/2003 | Wolk et al. | |
| 6,586,153 B2 | 7/2003 | Wolk et al. | |
| 6,608,439 B1 | 8/2003 | Sokolik et al. | |
| 6,639,250 B1 | 10/2003 | Shimoda et al. | |
| 6,642,652 B2 | 11/2003 | Collins, III et al. | |
| 6,689,538 B2 | 2/2004 | Hoffend, Jr. et al. | |
| 6,737,800 B1 * | 5/2004 | Winters et al. | 313/504 |
| 2001/0010884 A1 | 8/2001 | Guehler et al. | |
| 2001/0036561 A1 | 11/2001 | Wolk et al. | |
| 2001/0043043 A1 | 11/2001 | Aoyama et al. | |
| 2002/0015907 A1 | 2/2002 | Wolk et al. | |
| 2002/0160296 A1 | 10/2002 | Wolk et al. | |
| 2002/0164535 A1 | 11/2002 | Hoffend, Jr. et al. | |
| 2002/0172887 A1 | 11/2002 | Wolk et al. | |
| 2002/0197554 A1 | 12/2002 | Wolk et al. | |
| 2003/0044639 A1 | 3/2003 | Fukuda | |
| 2003/0124265 A1 | 7/2003 | Bellmann et al. | |
| 2003/0146696 A1 | 8/2003 | Park et al. | |
| 2003/0222577 A1 | 12/2003 | Lu | |
| 2004/0069995 A1 | 4/2004 | Magno et al. | |
| 2004/0087165 A1 | 5/2004 | Theiss et al. | |
| 2004/0135502 A1 | 7/2004 | Kobayashi et al. | |
| 2004/0140758 A1 | 7/2004 | Raychaudhuri et al. | |
| 2004/0195967 A1 | 10/2004 | Padiyath et al. | |
| 2004/0233139 A1 | 11/2004 | Asano et al. | |
| 2005/0062407 A1 | 3/2005 | Suh et al. | |
| 2005/0067945 A1 | 3/2005 | Nishikawa et al. | |
| 2005/0093434 A1 | 5/2005 | Suh et al. | |
| 2005/0093435 A1 | 5/2005 | Suh et al. | |
| 2005/0127824 A1 | 6/2005 | Mori et al. | |
| 2005/0161665 A1 * | 7/2005 | Winters | H01L 27/322 |
| | | | 257/40 |
| 2006/0158403 A1 * | 7/2006 | Kuma | 345/83 |

FOREIGN PATENT DOCUMENTS

| | | |
|---|---|---|
| EP | 0 866 644 | 9/1998 |
| EP | 1 052 708 A2 | 11/2000 |
| EP | 1 187 235 A2 | 3/2002 |
| EP | 1 220 191 A2 | 7/2002 |
| EP | 1 220 191 A3 | 7/2002 |
| EP | 1 248 121 A1 | 10/2002 |
| JP | 08-008061 | 1/1996 |
| JP | 1997-080434 | 3/1997 |
| JP | 1997-092466 | 4/1997 |
| JP | 10-092580 | 4/1998 |
| JP | 1998-223367 | 8/1998 |
| JP | 1999-329742 | 11/1999 |
| JP | 2000-195673 | 7/2000 |
| JP | 2002-08257 | 7/2000 |
| JP | 2002-84705 | 10/2000 |
| JP | 2000-323277 | 11/2000 |
| JP | 2002-071931 | 3/2002 |
| JP | 2002-151262 | 5/2002 |
| JP | 2000-2260845 | 9/2002 |
| JP | 2002-260845 | 9/2002 |
| JP | 2002-260866 | 9/2002 |
| JP | 2002-534782 | 10/2002 |
| JP | 2003-229271 | 8/2003 |
| JP | 2004-207065 | 7/2004 |
| JP | 2005-148475 | 6/2005 |
| KR | 1999-007825 | 1/1999 |
| TW | 200415939 | 8/2004 |
| WO | WO 98/55561 | 12/1998 |
| WO | WO 99/40655 | 8/1999 |
| WO | WO 00/18851 | 4/2000 |
| WO | WO 01/39554 A1 | 5/2000 |
| WO | WO 00/41892 | 7/2000 |
| WO | WO 00/70655 | 11/2000 |
| WO | WO 02/22374 | 3/2002 |
| WO | WO 2003-069957 | 8/2003 |
| WO | WO 2005/071770 A2 | 8/2005 |

OTHER PUBLICATIONS

Taiwanese Office action dated Mar. 20, 2012, for corresponding Taiwan Patent Application 094147105, 5 pages.

Japanese Office action dated May 17, 2011 issued to corresponding application No. JP 2007-549570, 2 pages.

Fetsko, NPIRI Raw Materials Data Handbook, vol. 4 (Pigments), Bethlehem, PA, 1983, cover page, title page, and table of contents only, 4 pgs.

"Vertical-Cavity Organic Light-Emitting Diode Display", IBM Technical Disclosure Bulletin, vol. 40, No. 9, Sep. 1997.

Benenson et al., "Geometric Optics," Chapter 11.1, *Handbook of Physics*, Springer, NY, 2001.

Jean-Pierre Budin, "Alternating Current Thin Film Elkectroluminescent Displays (ACTFEL)," *Display Systems Design and Applications*, John Wiley & Sons, 1997, pp. 192-201.

LeMaitre et al., "Colour by Blue Approach for Full-Colour Organic Light Emitting Displays", Organic Devices Laboratory, C.W. Tang and S.A. Vanslyke, *Appl. Phys. Lett.* 1987, 51, 913.

Chen et al., *Recent Developments in Molecular Organic Electroluminescent Materials*, Macromol. Symp., 125:1 (1997).

Kashiwabara et al., "29.5L : Late-News Paper: Advanced AM-OLED Display Based on White Emitter with Microcavity Structure," SID 04 Digest, p. 1017-1019, (May 2004).

Kraft, et al., *Angew. Chem. Int. Ed.*, 37, 402-428 (1998).

Nalwa et al., *Handbook of Luminescence, Display Materials and Devices*, Stevens Ranch, CA, American Scientific Publishers, 2003, p. 132-195.

From the Planar website—discussion of thin film EL technology < http://www.planar.com/Advantages/Technology/ContribList/Electroluminescent.html>.

(56) References Cited

OTHER PUBLICATIONS

Shinar, Joseph, ed., *Organic Light-Emitting Devices*, Berlin, Springer Verlag, 2003, p. 43-69.
Bellman, Erika, et al.; U.S. Appl. No. 10/989,526; "A Method of Making an Electroluminescent Device Including a Color Filter"; filed Nov. 16, 2004.
Bellman, Erika, et al.; U.S. Appl. No. 10/989,524; "A Method of Making an Electroluminescent Device Including a Color Conversion Element" filed Nov. 16, 2004.
Taiwan Office action dated Apr. 7, 2015, for corresponding Taiwanese Patent application 101122097, (5 pages).

\* cited by examiner

US 9,918,370 B2

ELECTROLUMINESCENT DEVICES AND METHODS OF MAKING ELECTROLUMINESCENT DEVICES INCLUDING AN OPTICAL SPACER

CROSS-REFERENCE TO RELATED APPLICATION(S)

This application is a continuation of U.S. patent application Ser. No. 11/024,202, filed Dec. 28, 2004, the disclosure of which is incorporated fully herein by reference.

FIELD OF THE INVENTION

Generally, the present disclosure relates to electroluminescent devices. In particular, the present disclosure relates to electroluminescent devices and methods of making electroluminescent devices that include an electroluminescent element and at least one optical spacer.

BACKGROUND

Light emitting devices, such as organic or inorganic electroluminescent devices, are useful in a variety of display, lighting, and other applications. Generally, these light emitting devices include one or more device layers, including at least one light emitting layer, disposed between two electrodes (an anode and a cathode). A voltage drop or current is provided between the two electrodes and charge is injected into the device. The charge recombines within the emission layer and excites a lumophore, which can be organic or inorganic, and which emits light. Typically, one or both of the electrodes is transparent so that light can be transmitted through the electrode to a viewer or other light receiver.

An electroluminescent device may be constructed such that it is either a top emitting device or a bottom emitting device. In a top emitting electroluminescent device, the light emitting layer or layers are positioned between the substrate and a viewer. In a bottom emitting electroluminescent device, a transparent or semitransparent substrate is positioned between the light emitting layer or layers and the viewer.

In a typical color electroluminescent display, one or more electroluminescent devices can be formed on a single substrate and arranged in groups or arrays. Several approaches exist for producing a color electroluminescent display. For example, one approach includes an array having red, green, and blue electroluminescent device subpixels placed next to each other. Another approach, for example, utilizes a white pixelated display in conjunction with red, green, and blue color filters.

SUMMARY

The present disclosure provides methods of making electroluminescent devices that include optical spacers in optical association with an electroluminescent element. In particular, the present disclosure provides techniques that include selective thermal transfer (e.g., Laser Induced Thermal Imaging (LITI)) of optical spacers for use with electroluminescent devices.

Patterning of red-, green-, and blue-emitting primary organic light emitting diode (OLED) materials for full color devices has proven to be difficult. Many techniques have been described for such patterning, including laser thermal patterning, ink jet patterning, shadow mask patterning, and photolithographic patterning.

Alternative techniques of providing a full color display without patterning the emitting materials include the use of color filters as described herein. However, the use of these alternative techniques with the traditional bottom emitting electroluminescent device construction is limited by physical and optical factors. For practical reasons, the color filters must be patterned either on a separate piece of glass or on the substrate. In this case, the effect of the distance between the light emitting layer and the color filter leads to parallax problems. In other words, Lambertian emission from the electroluminescent device allows the light to reach the corresponding color filter as well as a number of adjacent color filters. As a result, the color saturation level of the electroluminescent display is reduced.

On the other hand, top emitting electroluminescent devices may allow for more complex pixel control circuitry as well as more flexibility in the choice of semiconductor and substrate. In a typical top emitting device, the electroluminescent device layers can be deposited onto a substrate, followed by the formation of a thin, transparent metal electrode, and a protective layer.

To increase the color saturation of an OLED, it is possible to create an optical cavity that is tuned to pass light to match the light passed by a color filter (e.g., Kashiwabara et al., *SID Symposium Digest of Technical Papers*—May 2004, 35:1017-1019 (2004)). One approach to creating such optical cavities involves using a modified backplane for the electroluminescent element, as illustrated in FIG. 1. The electroluminescent device 10 includes a substrate 12, an electroluminescent element 20 formed on a major surface 14 of the substrate 12, an encapsulation layer 30 formed on the electroluminescent element 20, and optional color filters 40a, 40b, and 40c (hereinafter referred to collectively as color filters 40) formed on the encapsulation layer 30. Encapsulation layer 30 may be a thin film encapsulation layer that can function as a barrier to oxygen and moisture, for example. The electroluminescent element 20 includes a first electrode 22, a semitransparent second electrode 28, and one or more device layers 26 positioned between the first electrode 22 and the second electrode 28. The first electrode 22 includes a reflective portion 24 and transparent portions 25a, 25b, and 25c. Transparent portions 25a, 25b, and 25c of first electrode 22 are of different thicknesses to provide optical cavities having thicknesses 27a, 27b, and 27c (hereinafter referred to collectively as optical cavity thickness 27) between the reflective portion 24 of first electrode 22 and the semitransparent second electrode 28. The thicknesses of transparent portions 25a, 25b, and 25c of first electrode 22 can be varied to tune the optical cavity thickness 27 to the wavelength of the desired emission. The result is the narrowing of the emission band of each subpixel, allowing a uniform white OLED layer to emit, for example, "bluish," "greenish," and "reddish" light, each of which can be filtered with optional color filters 40. However, preparing the electroluminescent element 20 in which each subpixel of first electrode 22 has transparent portions 25a, 25b, and 25c with different thicknesses can be a tedious and expensive process.

In some embodiments, the present disclosure provides selective thermal transfer (e.g., LITI) techniques for forming top emitting electroluminescent devices that include optical spacers that are formed on the top electrode of an electroluminescent element or on a protective layer formed over the electroluminescent element. Providing optical spacers directly on the top electrode or on a protective layer may be used to prepare at least portions of optical cavities as described herein.

Further, selective thermal transfer patterning (e.g., LITI patterning, which is a dry, digital method), may be more compatible with the materials used for organic electroluminescent devices. Because it is a dry technique, selective thermal transfer may also allow for patterning of multiple layers on a single substrate without concern for the relative solubility of each layer.

In one aspect, the present disclosure provides a method of making an electroluminescent device. In one embodiment, the method includes: forming an electroluminescent element on a substrate; and selectively thermally transferring an optical spacer to the electroluminescent element to form at least a portion of an optical cavity. In another embodiment, the method includes: forming an electroluminescent element on a substrate; forming a protective layer over at least a portion of the electroluminescent element; and selectively thermally transferring an optical spacer to the protective layer to form at least a portion of an optical cavity.

In another aspect, the present disclosure provides a method of making an electroluminescent color display including at least one electroluminescent device. The method includes: forming the at least one electroluminescent device on a substrate, wherein forming the at least one electroluminescent device includes: forming an electroluminescent element on the substrate; and selectively thermally transferring an optical spacer to the electroluminescent element to form at least a portion of an optical cavity.

In another aspect, the present disclosure provides an electroluminescent device. The device includes: a substrate; an electroluminescent element on the substrate; and a plurality of optical spacers on the substrate, wherein at least one optical spacer of the plurality of optical spacers forms at least a portion of an optical cavity.

As used herein, "a," "an," "the," "at least one," and "one or more" are used interchangeably.

The above summary of the present invention is not intended to describe each disclosed embodiment or every implementation of the present invention. The Figures and the detailed description that follow more particularly exemplify illustrative embodiments.

DETAILED DESCRIPTION

In the following detailed description of illustrative embodiments, reference is made to the accompanying drawings that form a part hereof, and in which are shown, by way of illustration, specific embodiments in which the invention may be practiced. It is to be understood that other embodiments may be utilized and structural changes may be made without departing from the scope of the present invention.

The present disclosure is believed to be applicable to methods of making electroluminescent devices. Electroluminescent devices can include organic or inorganic light emitters or combinations of both types of light emitters. An organic electroluminescent (OEL) display or device refers to an electroluminescent display or device that includes at least one organic emissive material, whether that emissive material is a small molecule (SM) emitter (e.g., nonpolymeric emitter), a SM doped polymer, a SM blended polymer, a light emitting polymer (LEP), a doped LEP, a blended LEP, or another organic emissive material whether provided alone or in combination with any other organic or inorganic materials that are functional or non-functional in the OEL display or devices. Inorganic light emissive materials include phosphors, semiconductor nanocrystals, etc.

Generally, electroluminescent devices have one or more device layers, including at least one light emitting layer, disposed between two electrodes (an anode and a cathode). A voltage drop or current is provided between the two electrodes and charge is injected into the device. The charge recombines within the emission layer and excites a lumophore, which emits light.

Electroluminescent devices can also include thin film electroluminescent displays or devices. A thin film electroluminescent device includes an emissive material sandwiched between transparent dielectric layers and a matrix of row and column electrodes. Such thin film electroluminescent displays may include those described, e.g., in U.S. Pat. No. 4,897,319 (Sun) and U.S. Pat. No. 5,652,600 (Khormaei et al.).

Figure 1:
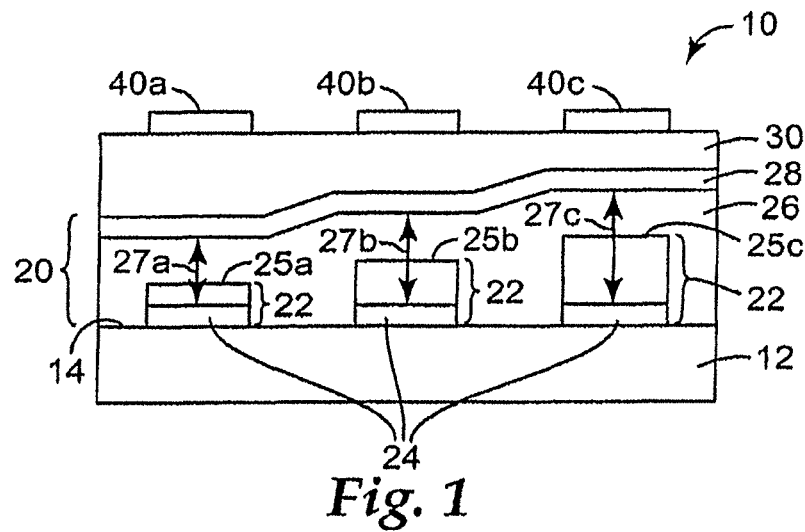
FIG. 1 is a schematic diagram of one embodiment of a top emitting electroluminescent device that includes optical cavities having different thicknesses.
Figure 2:
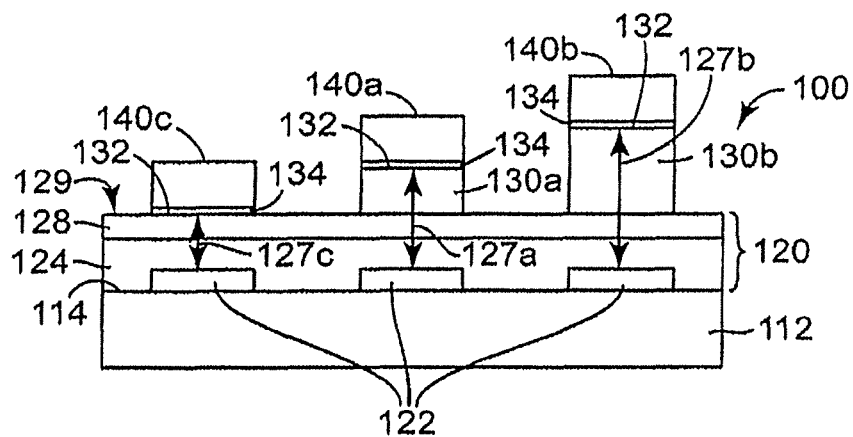
FIG. 2 is a schematic diagram of one embodiment of a top emitting electroluminescent device that includes optical spacers formed on an electroluminescent element.

FIG. 2 is a schematic diagram of one embodiment of an electroluminescent device 100. The electroluminescent device 100 includes a substrate 112, an electroluminescent element 120 formed on a major surface 114 of the substrate 112, and optical spacers 130a and 130b (hereinafter referred to collectively as optical spacers 130) formed on the electroluminescent element 120. The electroluminescent element 120 includes a first electrode 122, a second electrode 128, and one or more device layers 124 positioned between the first electrode 122 and the second electrode 128. The electroluminescent device 100 further includes partially reflective interface 132 on electroluminescent element 120 or on optical spacers 130, where present. In the embodiment illustrated in FIG. 2, partially reflective interface 132 arises from optional partially reflective layer 134 on electroluminescent element 120 and on optical spacers 130. The electroluminescent device 100 may further include optional color filters 140a, 140b, and/or 140c (hereinafter referred to collectively as color filters 140) on partially reflective interface 132 or optional partially reflective layer 134.

The substrate 112 of electroluminescent device 100 can be any substrate suitable for electroluminescent device or display applications. For example, the substrate 112 can be made of glass, clear plastic, or other suitable material(s) that are substantially transparent to visible light. The substrate 112 can also be opaque to visible light, for example stainless steel, crystalline silicon, or the like. In some instances, the first electrode 122 of electroluminescent element 120 can be the substrate 112. Because materials used in at least some electroluminescent devices can be particularly susceptible to damage due to exposure to oxygen or water, a suitable substrate can be selected to provide an adequate environmental barrier, or is supplied with one or more layers, coatings, or laminates that provide an adequate environmental barrier.

The substrate 112 can also include any number of devices or components suitable in electroluminescent devices and displays, such as transistor arrays and other electronic devices; color filters, polarizers, wave plates, diffusers, and other optical devices; insulators, barrier ribs, black matrix, mask work, and other such components; and the like. The substrate 112 may also include a plurality of independently addressable active devices as is described, e.g., in European Patent Application No. 1,220,191 (Kwon).

The electroluminescent device 100 also includes an electroluminescent element 120 formed on major surface 114 of the substrate 112. Although FIG. 2 illustrates electroluminescent element 120 as being formed on and in contact with major surface 114 of substrate 112, one or more layers or devices may be included between the electroluminescent element 120 and the major surface 114 of substrate 112. The electroluminescent element 120 includes a first electrode 122, a second electrode 128, and one or more device layers 124 positioned between the first electrode 122 and the second electrode 128. The first electrode 122 can be the anode and the second electrode 128 can be the cathode, or the first electrode 122 can be the cathode and the second electrode 128 can be the anode.

The first electrode 122 and the second electrode 128 are typically formed using electrically conducting materials such as metals, alloys, metallic compounds, metal oxides, conductive ceramics, conductive dispersions, and conductive polymers. Examples of suitable materials include, for example, gold, platinum, palladium, aluminum, calcium, titanium, titanium nitride, indium tin oxide (ITO), fluorine tin oxide (FTO), and polyaniline. The first and second electrodes 122 and 128 can be single layers of conducting materials or they can include multiple layers. For example, either one or both of the first electrode 122 and the second electrode 128 can include a layer of aluminum and a layer of gold, a layer of calcium and a layer of aluminum, a layer of aluminum and a layer of lithium fluoride, or a metal layer and a conductive organic layer. Preferably the first electrode is reflective and the second electrode is transparent.

Formed between the first electrode 122 and the second electrode 128 are the one or more device layers 124. The one or more device layers 124 include a light emitting layer. Optionally, the one or more device layers 124 can include one or more additional layers such as, for example, a hole transport layer or layers, an electron transport layer or layers, a hole injection layer or layers, an electron injection layer or layers, a hole blocking layer or layers, an electron blocking layer or layers, a buffer layer or layers, or any combination thereof.

The light emitting layer includes light emitting material. Any suitable light emitting material may be used in the light emitting layer. A variety of light emitting materials, including LEP and SM light emitters, can be used. The light emitters include, for example, fluorescent and phosphorescent materials. Examples of classes of suitable LEP materials include poly(phenylenevinylene)s (PPVs), poly-paraphenylenes (PPPs), polyfluorenes (PFs), other LEP materials now known or later developed, and co-polymers or blends thereof. Suitable LEPs can also be molecularly doped, dispersed with fluorescent dyes or other materials, blended with active or non-active materials, dispersed with active or non-active materials, and the like. Examples of suitable LEP materials are described in Kraft, et al., *Angew. Chem. Int. Ed.*, 37, 402-428 (1998); U.S. Pat. No. 5,621,131 (Kreuder et al.); U.S. Pat. No. 5,708,130 (Woo et al.); U.S. Pat. No. 5,728,801 (Wu et al.); U.S. Pat. No. 5,840,217 (Lupo et al.); U.S. Pat. No. 5,869,350 (Heeger et al.); U.S. Pat. No. 5,900,327 (Pei et al.); U.S. Pat. No. 5,929,194 (Woo et al.); U.S. Pat. No. 6,132,641 (Rietz et al.); and U.S. Pat. No. 6,169,163 (Woo et al.); and PCT Patent Application Publication No. 99/40655 (Kreuder et al.).

SM materials are generally non-polymeric organic or organometallic molecular materials that can be used in OEL displays and devices as emitter materials, charge transport materials, as dopants in emitter layers (e.g., to control the emitted color) or charge transport layers, and the like. Commonly used SM materials include metal chelate compounds, such as tris(8-hydroxyquinoline) aluminum (AlQ), and N,N'-bis(3-methylphenyl)-N,N'-diphenylbenzidine (TPD). Other SM materials are disclosed in, for example, C. H. Chen, et al., *Macromol. Symp.*, 125:1 (1997); Japanese Laid Open Patent Application 2000-195673 (Fujii); U.S. Pat. No. 6,030,715 (Thompson et al.); U.S. Pat. No. 6,150,043 (Thompson et al.); and U.S. Pat. No. 6,242,115 (Thomson et al.); and PCT Patent Application Publication Nos. WO 00/18851 (Shipley et al.) (divalent lanthanide metal complexes); and WO 00/70655 (Forrest et al.) (cyclometallated iridium compounds and others). Another class of materials is disclosed in, for example, PCT Patent Application Publication No. WO 98/55561 (Christou) (dendrimers).

The one or more device layers 124 may also include a hole transport layer. The hole transport layer facilitates the injection of holes from an anode into the electroluminescent element 120 and their migration towards a recombination zone. The hole transport layer can further act as a barrier for the passage of electrons to the anode. Any suitable material or materials may be used for the hole transport layer, e.g., those materials described in Nalwa et al., *Handbook of Luminescence, Display Materials and Devices*, Stevens Ranch, Calif., American Scientific Publishers, 2003, p. 132-195; Chen et al., *Recent Developments in Molecular Organic Electroluminescent Materials, Macromol. Symp.*, 1:125 (1997); and Shinar, Joseph, ed., *Organic Light-Emitting Devices*, Berlin, Springer Verlag, 2003, p. 43-69.

The one or more device layers 124 may also include an electron transport layer. The electron transport layer facilitates the injection of electrons and their migration towards the recombination zone. The electron transport layer can further act as a barrier for the passage of holes to a cathode if desired. Any suitable material or materials may be used for the electron transport layer, e.g., those materials described in Nalwa et al., *Handbook of Luminescence, Display Materials and Devices*, Stevens Ranch, Calif., American Scientific Publishers, 2003, p. 132-195; Chen et al., *Recent Developments in Molecular Organic Electroluminescent Materials, Macromol. Symp.*, 1:125 (1997); and Shinar, Joseph, ed., *Organic Light-Emitting Devices*, Berlin, Springer Verlag, 2003, p. 43-69.

It may be preferred that the electroluminescent element 120 be capable of emitting white light. Those skilled in the art will understand that materials for the light emitting layer of the electroluminescent element 120 may be selected such that the electroluminescent element 120 is capable of emitting white light, such as those described in European Patent Application No. 1,187,235 (Hatwar).

The one or more device layers 124 can be formed between the first electrode 122 and the second electrode 128 by a variety of techniques, e.g., coating (e.g., spin coating), printing (e.g., screen printing or ink jet printing), physical or chemical vapor deposition, photolithography, and thermal transfer methods (e.g., methods described in U.S. Pat. No.

6,114,088 (Wolk et al.)). The one or more device layers 124 can be formed sequentially, or two or more of the layers can be disposed simultaneously. After formation of the one or more device layers 124 or simultaneously with deposition of the device layers 124, the second electrode 128 is formed or otherwise disposed on the one or more device layers 124. Alternatively, the electroluminescent element 120 may be formed using LITI techniques that include a multilayer donor sheet as described, e.g., in U.S. Pat. No. 6,114,088 (Wolk et al.).

Electroluminescent element 120 may also include a protective layer or layers (not shown) formed over the electroluminescent element 120 as is further described herein.

The electroluminescent device 100 also includes optical spacers 130 formed on the electroluminescent element 120. One, two, or more optical spacers 130 may be formed on the electroluminescent element 120 such that at least a portion of light emitted from the electroluminescent element 120 passes through one or more optical spacers 130. In other words, the optical spacers 130 are in optical association with the electroluminescent element 120. The thicknesses of optical spacers 130a and 130b can be selected to provide optical cavities having the desired thickness 127a and 127b between the first electrode 122 and the partially reflective interface 132.

As evidenced by Kashiwabara et al. (*SID Symposium Digest of Technical Papers*—May 2004, 35:1017-1019 (2004)), adjusting the optical thickness between electrodes can influence the spectral content of the emitted light. Similarly, the thickness of an optical cavity, part of which may not be between the electrodes, can also influence the spectral content and angular distribution of the emitted light. Thus, selection of optical spacers that form at least a portion of the optical cavity provides a method for one of skill in the art to tune the optical cavity. Tuning of optical cavities is well known in the art, and the selection of indices and thicknesses can be readily calculated using known optical modeling techniques. What follows is an example of one technique of determining suitable combinations of indices and thicknesses.

The optical cavity can be tuned to enhance the emission of a wavelength $\lambda_o$ or a narrow wavelength bandwidth around $\lambda_o$. This can be accomplished by tuning the cavity to resonate such that light at $\lambda_o$ or in a wavelength bandwidth around $\lambda_o$ is allowed to pass through the cavity. For example, the effective optical thickness of the cavity can be tuned to a value that is a multiple of $\lambda_o/4$. A spacer can include one or more layers, each having the same or different thicknesses, and the same or different refractive indices. Optical cavity tuning can be accomplished by adjusting the thicknesses of the one or more spacer layers, the real part of refractive indices, the imaginary part of refractive indices (absorption constant), the anisotropy of the complex refractive indices, and the number of spacer layers (e.g., the number of quarter wave bi-layers).

Optical spacers 130 may include any suitable material or materials. Such materials are typically substantially transparent to the wavelength of light being emitted. For example, optical spacers 130 may include inorganic materials (e.g., ITO, nanoparticles), organic materials (e.g., polymers, both filled and unfilled; evaporable small molecules, amorphous small molecules), and combinations thereof (e.g., inorganic nanoparticles in an organic matrix as described, for example, in U.S. Pat. No. 5,783,115 (Bilkadi et al.), U.S. Pat. No. 6,329,058 (Arney et al.), and U.S. Pat. No. 6,432,526 (Arney et al.)). Suitable materials include those that are useful in thin film processes (e.g., solution coating, sputtering, evaporative deposition, chemical vapor deposition, molecular beam epitaxy, shadow masking techniques, and thermal transfer). Preferably the refractive index of optical spacers 130 is matched to the refractive index of the surface 129 of electroluminescent element 120. As used herein "index matched" optical spacers refer to optical spacers having a refractive index that is substantially the same as the refractive index of the surface 129 of electroluminescent element 120 (e.g., the ratio of the refractive index of the spacer 130 to that of the surface 129 is 0.82 to 1.22, or preferably, 0.94 to 1.07). Typically the refractive index of the surface 129 of electroluminescent element 120 is the refractive index of the material in the outermost layer of the second electrode 128 or any protective layers on second electrode 128. Optical spacers 130 can be one layer, or a plurality of layers (e.g., a dielectric stack).

In addition to the use of an optical spacer as at least a portion of a tuned optical cavity, the optical spacer can also be an absorbing filter (e.g., a color filter). For example, the optical spacer can include a material filled or doped with a pigment, a dye, or combinations thereof, such that the optical spacer transmits light of desired wavelengths and absorbs light of other wavelengths. In one embodiment, an optical spacer for a blue pixel can be filled with a blue pigment or dye; an optical spacer for a red pixel can be filled with a red pigment or dye; and/or an optical spacer for a green pixel can be filled with a green pigment or dye.

A separate color filter may not be needed for top emitting OLED devices having an optical spacer in which the optical spacer is also an absorbing filter. In addition, the absorbing filter can act to increase contrast and reduce glare by absorbing ambient light. The use of so-called "contrast enhancement filters" has been demonstrated to increase ambient contrast in emissive devices such as Field Emission Displays (FEDs) and Cathode Ray Tubes (CRTs).

Optical spacers 130 may be formed on electroluminescent element 120 using any suitable technique, e.g., coating (e.g., spin coating), printing (e.g., screen printing or ink jet printing), physical or chemical vapor deposition, photolithography, and thermal transfer methods (e.g., methods described in U.S. Pat. No. 6,114,088 (Wolk et al.)). It may be preferred that optical spacers 130 are formed on electroluminescent element 120 using LITI techniques as further described herein.

In the embodiment illustrated in FIG. 2, partially reflective interface 132 arises from optional partially reflective layer 134 on electroluminescent element 120 and on optical spacers 130. However, in other embodiments, partially reflective interface 132 may arise without optional partially reflective layer 134 present on electroluminescent element 120 or on optical spacers 130. For example, partially reflective interface 132 may arise when the refractive index of the material of optical spacer 130 is substantially mismatched with the refractive index of the material adjacent the optical spacer (e.g., the normal incidence reflectivity between optical spacer 130 and the material adjacent the spacer is at least ten percent). In another example, optical spacer 130 may include a dielectric stack that gives rise to partially reflective interface 132.

When present, optional partially reflective layer 134 may be formed on optical spacers 130 using any suitable technique, e.g., coating (e.g., spin coating), printing (e.g., screen printing or ink jet printing), physical or chemical vapor deposition, photolithography, and thermal transfer methods (e.g., methods described in U.S. Pat. No. 6,114,088 (Wolk et al.)). It may be preferred that partially reflective layer 134 is formed on optical spacers 130 using LITI techniques as further described herein.

Partially reflective layer 134 may include any suitable material or materials, provided that partially reflective layer 134 at least partially reflects a particular wavelength or frequency of radiation. Such materials may include inorganic materials (e.g., ITO, nanoparticles), organic materials (e.g., polymers, both filled and unfilled; evaporable small molecules, amorphous small molecules), and combinations thereof (e.g., inorganic nanoparticles in an organic matrix as described, for example, in U.S. Pat. No. 5,783,115 (Bilkadi et al.), U.S. Pat. No. 6,329,058 (Arney et al.), and U.S. Pat. No. 6,432,526 (Arney et al.)). Suitable materials include those that are useful in thin film processes (e.g., solution coating, sputtering, evaporative deposition, chemical vapor deposition, molecular beam epitaxy, shadow masking techniques, and thermal transfer). These materials may optionally be dispersed in a curable binder, e.g., a monomeric, oligomeric, or polymeric binder.

The electroluminescent device 100 may include optional color filters 140 formed on the partially reflective interface 132 or optional partially reflective layer 134. One, two, or more color filters 140 may be formed such that at least a portion of light emitted from the electroluminescent element 120 is incident upon one or more color filters 140. In other words, the color filters 140 are in optical association with the electroluminescent element 120. The color filters 140 attenuate particular wavelengths or frequencies while passing others with relatively no change in wavelength. For example, color filter 140a may pass green light, color filter 140b may pass red light, and color filter 140c may pass blue light. As used herein, the term "red light" refers to light having a spectrum predominantly in an upper portion of the visible spectrum. As further used herein, the term "green light" refers to light having a spectrum predominantly in a middle portion of the visible spectrum. And "blue light" refers to light having a spectrum predominantly in a lower portion of the visible spectrum.

Color filters 140 may include any suitable material or materials. For example, color filters 140 may include any suitable colorant or colorants, e.g., color dyes, color pigments, or any other materials provided that they can selectively attenuate particular wavelengths or frequencies of radiation. These materials may be dispersed in a curable binder, e.g., a monomeric, oligomeric, or polymeric binder.

Color filters 140 may be formed on partially reflective interface 132 or optional partially reflective layer 134 using any suitable technique, e.g., coating (e.g., spin coating), printing (e.g., screen printing or ink jet printing), physical or chemical vapor deposition, photolithography, and thermal transfer methods (e.g., methods described in U.S. Pat. No. 6,114,088 (Wolk et al.)). It may be preferred that color filters 140 are formed using LITI techniques as further described herein. See, e.g., U.S. application Ser. No. 10/989,526, filed Nov. 16, 2004, for examples of selective transfer of a color filter.

In processes of the present disclosure, emissive materials, including light emitting polymers (LEPs) or other materials, color conversion elements, and color filters, can be selectively transferred from the transfer layer of a donor sheet to a receptor substrate by placing the transfer layer of the donor element adjacent to the receptor (e.g., the electroluminescent element 120) and selectively heating the donor element. See, e.g., U.S. application Ser. No. 10/989,524, filed Nov. 16, 2004, for examples of selective transfer of color conversion elements. Color conversion elements may also be formed on optical spacers and filters to enhance color saturation and/or efficiency of light emission. In such a case, selection of the optical properties of the optical spacer can influence the overlap of the spectral emission of blue light and the absorption of the color conversion material, which may lead to higher efficiency of down conversion.

Illustratively, the donor element can be selectively heated by irradiating the donor element with imaging radiation that can be absorbed by light-to-heat converter (LTHC) material disposed in the donor, often in a separate LTHC layer, and converted into heat. Alternatively, LTHC can occur in any one or more of the layers in either the donor element and/or the receptor substrate. In these cases, the donor can be exposed to imaging radiation through the donor substrate, through the receptor, or both. The radiation can include one or more wavelengths, including visible light, infrared radiation, or ultraviolet radiation, for example from a laser, lamp, or other such radiation source. Other selective heating techniques can also be used, such as using a thermal print head or using a thermal hot stamp (e.g., a patterned thermal hot stamp such as a heated silicone stamp that has a relief pattern that can be used to selectively heat a donor). Material from the thermal transfer layer can be selectively transferred to a receptor in this manner to imagewise form patterns of the transferred material on the receptor. In many instances, thermal transfer using light from, for example, a lamp or laser, to patternwise expose the donor can be advantageous because of the accuracy and precision that can often be achieved. The size and shape of the transferred pattern (e.g., a line, circle, square, or other shape) can be controlled, for example, by selecting the size of the light beam, the exposure pattern of the light beam, the duration of directed beam contact with the donor sheet, or the materials of the donor sheet. The transferred pattern can also be controlled by irradiating the donor element through a mask.

As mentioned, a thermal print head or other heating element (patterned or otherwise) can also be used to selectively heat the donor element directly, thereby pattern-wise transferring portions of the transfer layer. In such cases, the light-to-heat converter material in the donor sheet or receptor is optional. Thermal print heads or other heating elements may be particularly suited for making lower resolution patterns of material or for patterning elements whose placement need not be precisely controlled.

Transfer layers can also be transferred in their entirety from donor sheets. For example, a transfer layer can be formed on a donor substrate that, in essence, acts as a temporary liner that can be released after the transfer layer is contacted to a receptor substrate, typically with the application of heat or pressure. Such a method, referred to as lamination transfer, can be used to transfer the entire transfer layer, or a large portion thereof, to the receptor.

The mode of thermal transfer can vary depending on the type of selective heating employed, the type of irradiation if used to expose the donor, the type of materials and properties of the optional LTHC layer, the type of materials in the transfer layer, the overall construction of the donor, the type of receptor substrate, and the like. Without wishing to be bound by any theory, transfer generally occurs via one or more mechanisms, one or more of which may be emphasized or de-emphasized during selective transfer depending on imaging conditions, donor constructions, and so forth. One mechanism of thermal transfer includes thermal melt-stick transfer whereby heating at the interface between the thermal transfer layer and the rest of the donor element results in adherence to the receptor more strongly than to the donor so that when the donor element is removed, the selected portions of the transfer layer remain on the receptor. Another mechanism of thermal transfer includes ablative transfer whereby localized heating can be used to ablate portions of the transfer layer off of the donor element, thereby directing ablated material toward the receptor. Yet another mechanism of thermal transfer includes sublimation whereby material dispersed in the transfer layer can be sublimed by heat generated in the donor element. A portion of the sublimed material can condense on the receptor. The present invention contemplates transfer modes that include one or more of these and other mechanisms whereby selective heating of a donor sheet can be used to cause the transfer of materials from a transfer layer to receptor surface.

A variety of radiation-emitting sources can be used to heat donor sheets. For analog techniques (e.g., exposure through a mask), high-powered light sources (e.g., xenon flash lamps and lasers) are useful. For digital imaging techniques, infrared, visible, and ultraviolet lasers are particularly useful. Suitable lasers include, for example, high power ($\geq$100 mW) single mode laser diodes, fiber-coupled laser diodes, and diode-pumped solid state lasers (e.g., Nd:YAG and Nd:YLF). Laser exposure dwell times can vary widely from, for example, a few hundredths of microseconds to tens of microseconds or more, and laser fluences can be in the range from, for example, about 0.01 to about 5 J/cm$^2$ or more. Other radiation sources and irradiation conditions can be suitable based on, among other things, the donor element construction, the transfer layer material, the mode of thermal mass transfer, and other such factors.

When high spot placement accuracy is desired (e.g., when patterning elements for high information content displays and other such applications) over large substrate areas, a laser can be particularly useful as the radiation source. Laser sources are also compatible with both large rigid substrates (e.g., 1 m×1 m×1.1 mm glass) and continuous or sheeted film substrates (e.g., 100 µm thick polyimide sheets).

During imaging, the donor sheet can be brought into intimate contact with a receptor (as might typically be the case for thermal melt-stick transfer mechanisms) or the donor sheet can be spaced some distance from the receptor (as can be the case for ablative transfer mechanisms or material sublimation transfer mechanisms). In at least some instances, pressure or vacuum can be used to hold the donor sheet in intimate contact with the receptor. In some instances, a mask can be placed between the donor sheet and the receptor. Such a mask can be removable or can remain on the receptor after transfer. If a light-to-heat converter material is present in the donor, a radiation source can then be used to heat the LTHC layer (or other layer(s) containing radiation absorber) in an imagewise fashion (e.g., digitally or by analog exposure through a mask) to perform imagewise transfer or patterning of the transfer layer from the donor sheet to the receptor.

Typically, selected portions of the transfer layer are transferred to the receptor without transferring significant portions of the other layers of the donor sheet, such as an optional interlayer or LTHC layer as is further described herein. The presence of the optional interlayer may eliminate or reduce the transfer of material from an LTHC layer or other proximate layers (for example, other interlayers) to the receptor or reduce distortion in the transferred portion of the transfer layer. Preferably, under imaging conditions, the adhesion of the optional interlayer to the LTHC layer is greater than the adhesion of the interlayer to the transfer layer. The interlayer can be transmissive, reflective, or absorptive to imaging radiation, and can be used to attenuate or otherwise control the level of imaging radiation transmitted through the donor or to manage temperatures in the donor, for example to reduce thermal or radiation-based damage to the transfer layer during imaging. Multiple interlayers can be present.

Large donor sheets can be used, including donor sheets that have length and width dimensions of a meter or more. In operation, a laser can be rastered or otherwise moved across the large donor sheet, the laser being selectively operated to illuminate portions of the donor sheet according to a desired pattern. Alternatively, the laser may be stationary and the donor sheet or receptor substrate moved beneath the laser.

In some instances, it may be necessary, desirable, or convenient to sequentially use two or more different donor sheets to form electronic devices on a receptor. For example, multiple layer devices can be formed by transferring separate layers or separate stacks of layers from different donor sheets. Multilayer stacks can also be transferred as a single transfer unit from a single donor element as is described, e.g., in U.S. Pat. No. 6,114,088 (Wolk et al.). For example, a hole transport layer and a LEP layer can be co-transferred from a single donor. As another example, a semiconductive polymer and an emissive layer can be co-transferred from a single donor. Multiple donor sheets can also be used to form separate components in the same layer on the receptor. For example, electroluminescent elements (e.g., electroluminescent element 120) can be patterned by selective thermal transfer of electrically active organic materials (oriented or not), followed by selective thermal transfer patterning of one or more pixel or sub-pixel elements such as color filters (e.g., color filters 140), emissive layers, charge transport layers, electrode layers, and the like.

Materials from separate donor sheets can be transferred adjacent to other materials on a receptor to form adjacent devices, portions of adjacent devices, or different portions of the same device. Alternatively, materials from separate donor sheets can be transferred directly on top of, or in partial overlying registration with, other layers or materials previously patterned onto the receptor by thermal transfer or some other method (e.g., photolithography, deposition through a shadow mask, etc.). A variety of other combinations of two or more donor sheets can be used to form a device, each donor sheet used to form one or more portions of the device. It will be understood that other portions of these devices, or other devices on the receptor, may be formed in whole or in part by any suitable process including photolithographic processes, ink jet processes, and various other printing or mask-based processes, whether conventionally used or newly developed.

The donor substrate can be a polymer film. One suitable type of polymer film is a polyester film, for example, polyethylene terephthalate (PET) or polyethylene naphthalate (PEN) films. However, other films with sufficient optical properties, including high transmission of light at a particular wavelength, or sufficient mechanical and thermal stability properties, depending on the particular application, can be used. The donor substrate, in at least some instances, is flat so that uniform coatings can be formed thereon. The donor substrate is also typically selected from materials that remain stable despite heating of one or more layers of the donor. However, as described herein, the inclusion of an underlayer between the substrate and an LTHC layer can be used to insulate the substrate from heat generated in the LTHC layer during imaging. The typical thickness of the donor substrate ranges from 0.025 to 0.15 mm, preferably 0.05 to 0.1 mm, although thicker or thinner donor substrates may be used.

The materials used to form the donor substrate and an optional adjacent underlayer can be selected to improve adhesion between the donor substrate and the underlayer, to control heat transport between the substrate and the underlayer, to control imaging radiation transport to the LTHC layer, to reduce imaging defects and the like. An optional priming layer can be used to increase uniformity during the coating of subsequent layers onto the substrate and also increase the bonding strength between the donor substrate and adjacent layers.

An optional underlayer may be coated or otherwise disposed between a donor substrate and the LTHC layer, for example to control heat flow between the substrate and the LTHC layer during imaging or to provide mechanical stability to the donor element for storage, handling, donor processing, or imaging. Examples of suitable underlayers and techniques of providing underlayers are disclosed in U.S. Pat. No. 6,284,425 (Staral et al.).

The underlayer can include materials that impart desired mechanical or thermal properties to the donor element. For example, the underlayer can include materials that exhibit a low specific heat×density or low thermal conductivity relative to the donor substrate. Such an underlayer may be used to increase heat flow to the transfer layer, for example to improve the imaging sensitivity of the donor.

The underlayer may also include materials for their mechanical properties or for adhesion between the substrate and the LTHC. Using an underlayer that improves adhesion between the substrate and the LTHC layer may result in less distortion in the transferred image. As an example, in some cases an underlayer can be used that reduces or eliminates delamination or separation of the LTHC layer, for example, that might otherwise occur during imaging of the donor media. This can reduce the amount of physical distortion exhibited by transferred portions of the transfer layer. In other cases, however it may be desirable to employ underlayers that promote at least some degree of separation between or among layers during imaging, for example to produce an air gap between layers during imaging that can provide a thermal insulating function. Separation during imaging may also provide a channel for the release of gases that may be generated by heating of the LTHC layer during imaging. Providing such a channel may lead to fewer imaging defects.

The underlayer may be substantially transparent at the imaging wavelength, or may also be at least partially absorptive or reflective of imaging radiation. Attenuation or reflection of imaging radiation by the underlayer may be used to control heat generation during imaging.

An LTHC layer can be included in donor sheets of the present disclosure to couple irradiation energy into the donor sheet. The LTHC layer preferably includes a radiation absorber that absorbs incident radiation (e.g., laser light) and converts at least a portion of the incident radiation into heat to enable transfer of the transfer layer from the donor sheet to the receptor.

Generally, the radiation absorber(s) in the LTHC layer absorb light in the infrared, visible, or ultraviolet regions of the electromagnetic spectrum and convert the absorbed radiation into heat. The radiation absorber(s) are typically highly absorptive of the selected imaging radiation, providing an LTHC layer with an optical density at the wavelength of the imaging radiation in the range of about 0.2 to 3 or higher. Optical density of a layer is the absolute value of the logarithm (base 10) of the ratio of the intensity of light transmitted through the layer to the intensity of light incident on the layer.

Radiation absorber material can be uniformly disposed throughout the LTHC layer or can be non-homogeneously distributed. For example, as described in U.S. Pat. No. 6,228,555 (Hoffend, Jr., et al.), non-homogeneous LTHC layers can be used to control temperature profiles in donor elements. This can give rise to donor sheets that have improved transfer properties (e.g., better fidelity between the intended transfer patterns and actual transfer patterns).

Suitable radiation absorbing materials can include, for example, dyes (e.g., visible dyes, ultraviolet dyes, infrared dyes, fluorescent dyes, and radiation-polarizing dyes), pigments, metals, metal compounds, metal films, black body absorbers, and other suitable absorbing materials. Examples of suitable radiation absorbers includes carbon black, metal oxides, and metal sulfides. One example of a suitable LTHC layer can include a pigment, such as carbon black, and a binder, such as an organic polymer. Another suitable LTHC layer includes metal or metal/metal oxide fainted as a thin film, for example, black aluminum (i.e., a partially oxidized aluminum having a black visual appearance). Metallic and metal compound films may be formed by techniques, such as, for example, sputtering and evaporative deposition. Particulate coatings may be formed using a binder and any suitable dry or wet coating techniques. LTHC layers can also be formed by combining two or more LTHC layers containing similar or dissimilar materials. For example, an LTHC layer can be formed by vapor depositing a thin layer of black aluminum over a coating that contains carbon black disposed in a binder.

Dyes suitable for use as radiation absorbers in a LTHC layer may be present in particulate form, dissolved in a binder material, or at least partially dispersed in a binder material. When dispersed particulate radiation absorbers are used, the particle size can be, at least in some instances, about 10 μm or less, and may be about 1 μm or less. Suitable dyes include those dyes that absorb in the IR region of the spectrum. A specific dye may be chosen based on factors such as, solubility in, and compatibility with, a specific binder or coating solvent, as well as the wavelength range of absorption.

Pigmentary materials may also be used in the LTHC layer as radiation absorbers. Examples of suitable pigments include carbon black and graphite, as well as phthalocyanines, nickel dithiolenes, and other pigments described in U.S. Pat. No. 5,166,024 (Bugner et al.) and U.S. Pat. No. 5,351,617 (Williams et al.). Additionally, black azo pigments based on copper or chromium complexes of, for example, pyrazolone yellow, dianisidine red, and nickel azo yellow can be useful. Inorganic pigments can also be used, including, for example, oxides and sulfides of metals such as aluminum, bismuth, tin, indium, zinc, titanium, chromium, molybdenum, tungsten, cobalt, iridium, nickel, palladium, platinum, copper, silver, gold, zirconium, iron, lead, and tellurium. Metal borides, carbides, nitrides, carbonitrides, bronze-structured oxides, and oxides structurally related to the bronze family (e.g., $WO_{2.9}$) may also be used.

Metal radiation absorbers may be used, either in the form of particles, as described for instance in U.S. Pat. No. 4,252,671 (Smith), or as films, as disclosed in U.S. Pat. No. 5,256,506 (Ellis et al.). Suitable metals include, for example, aluminum, bismuth, tin, indium, tellurium and zinc.

Suitable binders for use in the LTHC layer include film-forming polymers, such as, for example, phenolic resins (e.g., novolak and resole resins), polyvinyl butyral resins, polyvinyl acetates, polyvinyl acetals, polyvinylidene chlorides, polyacrylates, cellulosic ethers and esters, nitrocelluloses, and polycarbonates. Suitable binders may include monomers, oligomers, or polymers that have been, or can be, polymerized or crosslinked. Additives such as photoinitiators may also be included to facilitate crosslinking of the LTHC binder. In some embodiments, the binder is primarily formed using a coating of crosslinkable monomers or oligomers with optional polymer.

The inclusion of a thermoplastic resin (e.g., polymer) may improve, in at least some instances, the performance (e.g., transfer properties or coatability) of the LTHC layer. It is thought that a thermoplastic resin may improve the adhesion of the LTHC layer to the donor substrate. In one embodiment, the binder includes 25 to 50 wt. % (excluding the solvent when calculating weight percent) thermoplastic resin, and, preferably, 30 to 45 wt. % thermoplastic resin, although lower amounts of thermoplastic resin may be used (e.g., 1 to 15 wt. %). The thermoplastic resin is typically chosen to be compatible (i.e., form a one-phase combination) with the other materials of the binder. In at least some embodiments, a thermoplastic resin that has a solubility parameter in the range of 9 to 13 $(cal/cm^3)^{1/2}$, preferably, 9.5 to 12 $(cal/cm^3)^{1/2}$, is chosen for the binder. Examples of suitable thermoplastic resins include polyacrylics, styrene-acrylic polymers and resins, and polyvinyl butyral.

Conventional coating aids, such as surfactants and dispersing agents, may be added to facilitate the coating process. The LTHC layer may be coated onto the donor substrate using a variety of coating methods known in the art. A polymeric or organic LTHC layer can be coated, in at least some instances, to a thickness of 0.05 µm to 20 µm, preferably, 0.5 µm to 10 µm, and, more preferably, 1 µm to 7 µm. An inorganic LTHC layer can be coated, in at least some instances, to a thickness in the range of 0.0005 to 10 µm, and preferably, 0.001 to 1 µm.

At least one optional interlayer may be disposed between the LTHC layer and transfer layer. The interlayer can be used, for example, to minimize damage and contamination of the transferred portion of the transfer layer and may also reduce distortion or mechanical damage of in the transferred portion of the transfer layer. The interlayer may also influence the adhesion of the transfer layer to the rest of the donor sheet. Typically, the interlayer has high thermal resistance. Preferably, the interlayer does not distort or chemically decompose under the imaging conditions, particularly to an extent that renders the transferred image non-functional. The interlayer typically remains in contact with the LTHC layer during the transfer process and is not substantially transferred with the transfer layer.

Suitable interlayers include, for example, polymer films, metal layers (e.g., vapor deposited metal layers), inorganic layers (e.g., sol-gel deposited layers and vapor deposited layers of inorganic oxides (e.g., silica, titania, and other metal oxides)), and organic/inorganic composite layers. Organic materials suitable as interlayer materials include both thermoset and thermoplastic materials. Suitable thermoset materials include resins that may be crosslinked by heat, radiation, or chemical treatment including, but not limited to, crosslinked or crosslinkable polyacrylates, polymethacrylates, polyesters, epoxies, and polyurethanes. The thermoset materials may be coated onto the LTHC layer as, for example, thermoplastic precursors and subsequently crosslinked to form a crosslinked interlayer.

Suitable thermoplastic materials include, for example, polyacrylates, polymethacrylates, polystyrenes, polyurethanes, polysulfones, polyesters, and polyimides. These thermoplastic organic materials may be applied via conventional coating techniques (for example, solvent coating, spray coating, or extrusion coating). Typically, the glass transition temperature ($T_g$) of thermoplastic materials suitable for use in the interlayer is 25° C. or greater, preferably 50° C. or greater. In some embodiments, the interlayer includes a thermoplastic material that has a $T_g$ greater than any temperature attained in the transfer layer during imaging. The interlayer may be either transmissive, absorbing, reflective, or some combination thereof, at the imaging radiation wavelength.

Inorganic materials suitable as interlayer materials include, for example, metals, metal oxides, metal sulfides, and inorganic carbon coatings, including those materials that are highly transmissive or reflective at the imaging light wavelength. These materials may be applied to the light-to-heat-conversion layer via conventional techniques (e.g., vacuum sputtering, vacuum evaporation, or plasma jet deposition).

The interlayer may provide a number of benefits. The interlayer may be a barrier against the transfer of material from the light-to-heat conversion layer. The interlayer may also act as a barrier that can prevent any material or contamination exchange to or from layers proximate thereto. It may also modulate the temperature attained in the transfer layer so that thermally unstable materials can be transferred. For example, the interlayer can act as a thermal diffuser to control the temperature at the interface between the interlayer and the transfer layer relative to the temperature attained in the LTHC layer. This may improve the quality (i.e., surface roughness, edge roughness, etc.) of the transferred layer. The presence of an interlayer may also result in improved plastic memory in the transferred material.

The interlayer may contain additives, including, for example, photoinitiators, surfactants, pigments, plasticizers, and coating aids. The thickness of the interlayer may depend on factors such as, for example, the material of the interlayer, the material and properties of the LTHC layer, the material and properties of the transfer layer, the wavelength of the imaging radiation, and the duration of exposure of the donor sheet to imaging radiation. For polymer interlayers, the thickness of the interlayer typically is in the range of 0.05 µm to 10 µm. For inorganic interlayers (e.g., metal or metal compound interlayers), the thickness of the interlayer typically is in the range of 0.005 µm to 10 µm. Multiple interlayers can also be used; for example, an organic-based interlayer can be covered by an inorganic-based interlayer to provide additional protection to the transfer layer during the thermal transfer process.

A thermal transfer layer is included in the donor sheet. The transfer layer can include any suitable material or materials, disposed in one or more layers, alone or in combination with other materials. The transfer layer is capable of being selectively transferred as a unit or in portions by any suitable transfer mechanism when the donor element is exposed to direct heating or to imaging radiation that can be absorbed by light-to-heat converter material and converted into heat. In some embodiments, the thermal transfer layer can include light-to-heat conversion material.

The thermal transfer layer can be used to form, for example, color filters, electronic circuitry, resistors, capacitors, diodes, rectifiers, electroluminescent lamps, memory elements, field effect transistors, bipolar transistors, unijunction transistors, MOS transistors, metal-insulator-semiconductor transistors, charge coupled devices, insulator-metal-insulator stacks, organic conductor-metal-organic conductor stacks, integrated circuits, photodetectors, lasers, lenses, waveguides, gratings, holographic elements, filters (e.g., add-drop filters, gain-flattening filters, cut-off filters, and the like), mirrors, splitters, couplers, combines, modulators, sensors (e.g., evanescent sensors, phase modulation sensors, interferometric sensors, and the like), optical spacers, optical cavities, piezoelectric devices, ferroelectric devices, thin film batteries, or combinations thereof; for example, the combination of field effect transistors and organic electroluminescent lamps as an active matrix array for an optical display. Other items may be formed by transferring a multicomponent transfer unit and/or a single layer.

The transfer layer can be selectively thermally transferred from the donor element to a proximately located receptor substrate. There can be, if desired, more than one transfer layer so that a multilayer construction is transferred using a single donor sheet. The receptor substrate may be any item suitable for a particular application including, but not limited to, glass, transparent films, reflective films, metals, semiconductors, and plastics. For example, receptor substrates may be any type of substrate or display element suitable for display applications, e.g., emissive displays, reflective displays, transflective displays, micromechanical displays, and the like. Receptor substrates suitable for use in displays such as liquid crystal displays or emissive displays include rigid or flexible substrates that are substantially transmissive to visible light. Examples of suitable rigid receptors include glass and rigid plastic that are coated or patterned with indium tin oxide or are circuitized with low temperature poly-silicon (LIPS) or other transistor structures, including organic transistors.

Suitable flexible substrates include substantially clear and transmissive polymer films, reflective films, transflective films, polarizing films, multilayer optical films, metallic films, metallic sheets, metallic foils, and the like. Flexible substrates can also be coated or patterned with electrode materials or transistors, for example transistor arrays formed directly on the flexible substrate or transferred to the flexible substrate after being formed on a temporary carrier substrate. Suitable polymer substrates include polyester base (e.g., polyethylene terephthalate, polyethylene naphthalate), polycarbonate resins, polyolefin resins, polyvinyl resins (e.g., polyvinyl chloride, polyvinylidene chloride, polyvinyl acetals, etc.), cellulose ester bases (e.g., cellulose triacetate, cellulose acetate), and other conventional polymeric films used as supports. For making organic electroluminescent devices on plastic substrates, it is often desirable to include a barrier film or coating on one or both surfaces of the plastic substrate to protect the organic light emitting devices and their electrodes from exposure to undesired levels of water, oxygen, and the like.

Receptor substrates can be pre-patterned with any one or more of electrodes, transistors, capacitors, insulator ribs, spacers, color filters, black matrix, hole transport layers, electron transport layers, and other elements useful for electronic displays or other devices. To form optical spacers (e.g., optical spacers 130 of FIG. 2), any suitable material may be included in one or more transfer layers of the donor sheet.

When the optical spacer transfer layer is induced by a high powered light source (i.e., xenon flash lamp), it may be necessary to include as binder an energetic or gas producing polymer such as disclosed in U.S. Pat. No. 5,308,737 (Bills et al.) and U.S. Pat. No. 5,278,023 (Bills et al.). The transfer layer materials may be optionally crosslinked before or after laser transfer in order to improve performance of the imaged optical spacer. Crosslinking of the optical spacer material may be effected by radiation, heat, and/or chemical curative. The optical spacer transfer layer may also contain a variety of additives including but not limited to dyes, plasticizers, UV-stabilizers, film forming additives, photoinitiators for photo-crosslinked or photo-crosslinkable optical spacer transfer layers, and adhesives. In general, a dry coating thickness of 10 Å to 3 micrometers may be desired.

A method of making an electroluminescent device will now be described in reference to the electroluminescent device 100 of FIG. 2. The electroluminescent element 120 of device 100 is formed on the major surface 114 of the substrate 112 using any suitable technique, e.g., LITI patterning as described herein. Optical spacers 130 are selectively thermally transferred to the electroluminescent element 120 as is also described herein. The optical spacers 130 may be transferred to the electroluminescent element 120 such that the optical spacers 130 are on the second electrode 128. Alternatively, the optical spacers 130 may be transferred to a protective layer (not shown) that is formed over at least a portion of the electroluminescent element 120 as is further described herein. Partially reflective interface 132 is present or formed on electroluminescent element 120 or optical spacers 130, where present. Partially reflective interface 132 may arise from optional partially reflective layer 134, which can be formed on electroluminescent element 120 or on optical spacers 130 by any suitable means. Optionally, color filters 140 can be formed on partially reflective interface 132 or partially reflective layer 134 by any suitable means. In some embodiments, a black matrix may be formed, for example, on the electroluminescent element 120, and the optical spacers 130 then transferred to apertures in the black matrix as is further described herein.

Figure 3:
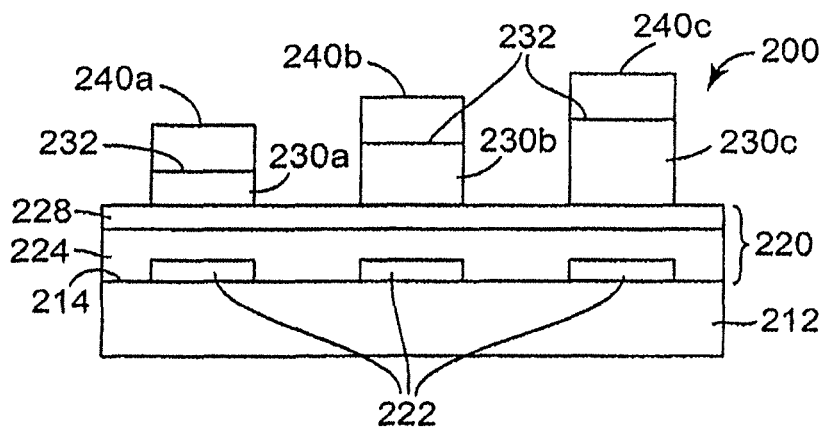
FIG. 3 is a schematic diagram of another embodiment of a top emitting electroluminescent device that includes optical spacers formed on an electroluminescent element.

FIG. 3 is a schematic diagram of another embodiment of an electroluminescent device 200. The electroluminescent device 200 is similar in many respects to electroluminescent device 100 of FIG. 2. In the embodiment shown in FIG. 3, electroluminescent device 200 includes a substrate 212, an electroluminescent element 220 formed on a major surface 214 of substrate 212, and optical spacers 230a, 230b, and 230c (hereinafter referred to collectively as optical spacers 230) formed on electroluminescent element 220. The electroluminescent element 220 includes a first electrode 222, a second electrode 228, and one or more device layers 224 positioned between the first electrode 222 and the second electrode 228. The electroluminescent device 200 further includes partially reflective interface 232 on optical spacers 230. The electroluminescent device 200 may further include optional color filters 240a, 240b, and/or 240c (hereinafter referred to collectively as color filters 240) on partially reflective interface 232. All of the design considerations and possibilities described herein with respect to the substrate 112, the electroluminescent element 120, the optical spacers 130, and the partially reflective interface 132 of the embodiment illustrated in FIG. 2 apply equally to the substrate 212, the electroluminescent element 220, the optical spacers 230, and the partially reflective interface 232 of the embodiment illustrated in FIG. 3.

Figure 4:
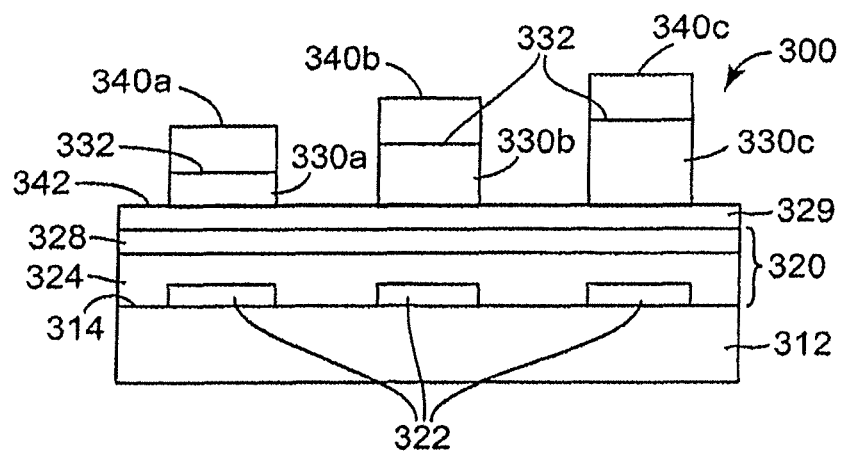
FIG. 4 is a schematic diagram of another embodiment of a top emitting electroluminescent device that includes optical spacers formed on a protective layer.

FIG. 4 is a schematic diagram of another embodiment of an electroluminescent device 300. The electroluminescent device 300 is similar in many respects to electroluminescent device 100 of FIG. 2 and electroluminescent device 200 of FIG. 3. In the embodiment shown in FIG. 4, electroluminescent device 300 includes a substrate 312, an electroluminescent element 320 formed on a major surface 314 of substrate 312, and optical spacers 330a, 330b, and 330c (hereinafter referred to collectively as optical spacers 330) formed on protective layer 329. The electroluminescent element 320 includes a first electrode 322, a second electrode 328, and one or more device layers 324 positioned between the first electrode 322 and the second electrode 328. The electroluminescent device 300 further includes partially reflective interface 332 on optical spacers 330. The electroluminescent device 300 may further include optional color filters 340a, 340b, and/or 340c (hereinafter referred to collectively as color filters 340) on partially reflective interface 332. All of the design considerations and possibilities described herein with respect to the substrate 112, the electroluminescent element 120, the optical spacers 130, and the partially reflective interface 132 of the embodiment illustrated in FIG. 2; and with respect to the substrate 212, the electroluminescent element 220, the optical spacers 230, and the partially reflective interface 232 of the embodiment illustrated in FIG. 3; apply equally to the substrate 312, the electroluminescent element 320, the optical spacers 330, and the partially reflective interface 332 of the embodiment illustrated in FIG. 4.

Electroluminescent device 300 also includes a protective layer 329 formed over at least a portion of the electroluminescent element 320. The protective layer 329 may be formed on and in contact with the electroluminescent element 320. Alternatively, an optional layer or layers may be included between the electroluminescent element 320 and the protective layer 329.

The protective layer 329 may be any suitable type of layer or layers that protect the electroluminescent element 320, e.g., barrier layers, encapsulant layers, etc. The protective layer 329 may be formed using any suitable material or materials, e.g., as described in U.S. Patent Application Publication No. 2004/0195967 (Padiyath et al.) and U.S. Pat. No. 6,522,067 (Graff et al.).

The optical spacers 330 are transferred to protective layer 329. As described herein in regard to optical spacers 130 of electroluminescent device 100 of FIG. 2, and to optical spacers 230 of FIG. 3, the optical spacers 330 of electroluminescent device 300 may be formed using any suitable technique, e.g., coating (e.g., spin coating), printing (e.g., screen printing or ink jet printing), physical or chemical vapor deposition, photolithography, and thermal transfer methods (e.g., methods described in U.S. Pat. No. 6,114,088 (Wolk et al.)). It may be preferred that the optical spacers 330 are transferred to the protective layer 329 using LITI techniques as described herein.

Figure 5:
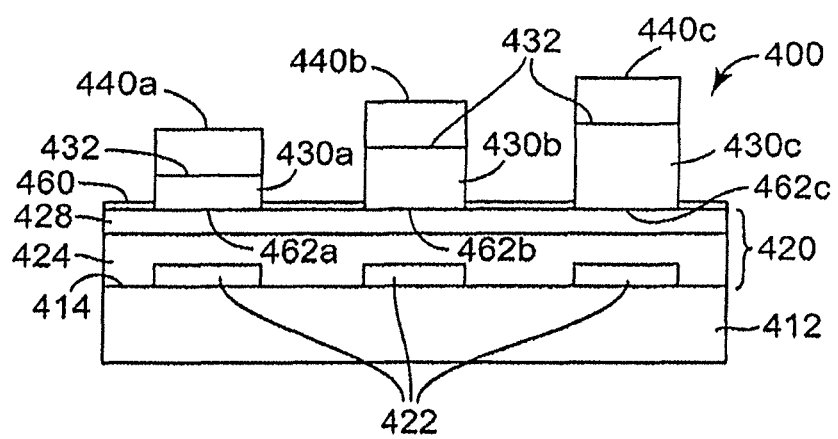
FIG. 5 is a schematic diagram of another embodiment of a top emitting electroluminescent device that includes optical spacers formed on an electroluminescent element in apertures of a black matrix.

Other elements may be formed on the electroluminescent element, protective layer, or optical spacers, e.g., black matrix, etc. For example, FIG. 5 is a schematic diagram of another embodiment of an electroluminescent device 400. Electroluminescent device 400 is similar in many respects to electroluminescent device 100 of FIG. 2, electroluminescent device 200 of FIG. 3, and electroluminescent device 300 of FIG. 4. Electroluminescent device 400 includes a substrate 412, an electroluminescent element 420 formed on a major surface 414 of the substrate 412, and optical spacers 430a, 430b, and 430c (hereinafter referred to collectively as optical spacers 430) formed on the electroluminescent element 420. Electroluminescent element 420 includes a first electrode 422, a second electrode 428, and one or more device layers 424 positioned between the first electrode 422 and the second electrode 428. The electroluminescent device 400 further includes partially reflective interface 432 on optical spacers 430. The electroluminescent device 400 may further include optional color filters 440a, 440b, and/or 440c (hereinafter referred to collectively as color filters 440) on partially reflective interface 432. All of the design considerations and possibilities described herein with respect to substrate 112, electroluminescent element 120, optical spacers 130, and partially reflective interface 132 of the embodiment illustrated in FIG. 2; to substrate 212, electroluminescent element 220, optical spacers 230, and partially reflective interface 232 of the embodiment illustrated in FIG. 3; and to substrate 312, electroluminescent element 320, optical spacers 330, and partially reflective interface 332 of the embodiment illustrated in FIG. 4; apply equally to the substrate 412, the electroluminescent element 420, the optical spacers 430, and partially reflective interface 432 of the embodiment illustrated in FIG. 5.

Electroluminescent device 400 further includes an optional black matrix 460 formed on the electroluminescent element 420. Black matrix 460 includes a plurality of apertures 462a, 462b, and 462c (hereinafter referred to collectively as apertures 462). Although the embodiment illustrated in FIG. 5 includes only three apertures 462, the black matrix 460 can include any suitable number of apertures. Each aperture 462 may take any suitable shape, e.g., oval, rectangular, polygonal, etc.

In some embodiments, the optical spacers 430 may be transferred to the electroluminescent element 420 such that each optical spacer 430 is transferred to an aperture 462 of optional black matrix 460 using any suitable technique as described herein. For example, optical spacer 430a can be transferred to aperture 462a of black matrix 460.

In some embodiments, one or more of the substrate 412, the one or more device layers 424, the optical spacers 430, and the optional color filters 440 may be configured to provide polarized light as is further described, e.g., in U.S. Pat. No. 6,485,884 (Wolk et al.) and U.S. Pat. No. 5,693,446 (Staral et al.).

All documents and publications cited herein are expressly incorporated herein by reference in their entirety into this disclosure. Illustrative embodiments of this invention are discussed and reference has been made to possible variations within the scope of this invention. These and other variations and modifications in the invention will be apparent to those skilled in the art without departing from the scope of the invention, and it should be understood that this invention is not limited to the illustrative embodiments set forth herein. Accordingly, the invention is to be limited only by the claims provided below.

What is claimed is:

1. An electroluminescent device comprising:
a substrate;
an electroluminescent element on the substrate, wherein the electroluminescent element comprises a first electrode; a second electrode; and at least a portion of a plurality of sub-pixels;
a plurality of optical spacers located on a side of the electroluminescent element opposing the substrate, wherein each optical spacer directly contacts the electroluminescent element; and
a plurality of partially reflective interface layers located on the side of the electroluminescent element opposing the substrate and having a thickness extending in a direction away from the substrate,
wherein in at least two of the sub-pixels, a corresponding one of the optical spacers is between the electroluminescent element and a corresponding one of the partially reflective interface layers to form a top emitting electroluminescent device,
wherein a refractive index of the optical spacers is substantially mismatched with a refractive index of a respective one of the partially reflective interface layers,
wherein the partially reflective interface layers are at different distances from a surface of the first electrode, and wherein the refractive index of the optical spacers is matched to a refractive index of a surface of the electroluminescent element.

2. The electroluminescent device of claim 1, wherein at least a portion of each of the optical spacers comprises an absorbing color filter.

3. The electroluminescent device of claim 1, wherein each partially reflective interface layer is on a corresponding one of the optical spacers.

4. The electroluminescent device of claim 3 further comprising a plurality of color filter elements on the partially reflective interface layers.

5. The electroluminescent device of claim 1, wherein at least one optical spacer of the plurality of optical spacers forms at least a portion of an optical cavity tuned to pass a first color of light, and at least one optical spacer of the plurality of optical spacers forms at least a portion of an optical cavity tuned to pass a second color of light.

6. The electroluminescent device of claim 5, wherein the first color of light is red and the second color of light is green.

7. The electroluminescent device of claim 6, further wherein at least one optical spacer of the plurality of optical spacers forms at least a portion of an optical cavity tuned to pass blue light.

8. The electroluminescent device of claim 7 further comprising a plurality of color filters on the partially reflective interface layers, wherein at least one color filter of the plurality of color filters is a red color filter on the optical cavity tuned to pass red light, at least one color filter of the plurality of color filters is a green color filter on the optical cavity tuned to pass green light, and at least one color filter of the plurality of color filters is a blue color filter on the optical cavity tuned to pass blue light.

9. The electroluminescent device of claim 1, wherein at least one optical spacer of the plurality of optical spacers forms at least a portion of an optical cavity tuned to effect emission of a first color of light, and at least one optical spacer of the plurality of optical spacers forms at least a portion of an optical cavity tuned to effect emission of a second color of light.

10. The electroluminescent device of claim 9, wherein the first color of light is red and the second color of light is green.

11. The electroluminescent device of claim 10, further wherein at least one optical spacer of the plurality of optical spacers forms at least a portion of an optical cavity tuned to effect emission of blue light.

12. The electroluminescent device of claim 11 further comprising a plurality of color filters on the partially reflective interface layers, wherein at least one color filter of the plurality of color filters is a red color filter on the optical cavity tuned to effect emission of red light, at least one color filter of the plurality of color filters is a green color filter on the optical cavity tuned to effect emission of green light, and at least one color filter of the plurality of color filters is a blue color filter on the optical cavity tuned to effect emission of blue light.

13. An electroluminescent device comprising:
a substrate;
an electroluminescent element on the substrate, the electroluminescent element comprising a first electrode and a second electrode having an interval with the first electrode;
an optical spacer for influencing an emission of light, the optical spacer positioned on the second electrode; and
a partially reflective interface,
wherein the optical spacer is entirely between the electroluminescent element and the partially reflective interface,
wherein the optical spacer forms at least a portion of an optical cavity between the first electrode and the partially reflective interface,
wherein a refractive index of the optical spacer is substantially mismatched with a refractive index of a material adjacent the optical spacer to form the partially reflective interface, and
wherein the refractive index of the optical spacer is matched to a refractive index of a surface of the electroluminescent element.

14. The electroluminescent device of claim 13, wherein the optical spacer is a color filter.

15. The electroluminescent device of claim 13, wherein the partially reflective interface is on the optical spacer.

16. The electroluminescent device of claim 13 further comprising a color filter element on the partially reflective interface.

17. The electroluminescent device of claim 13, wherein the optical spacer forms at least a portion of an optical cavity tuned to pass one color of light of red, green and blue light.

18. The electroluminescent device of claim 16, wherein the color filter element is one of a red color filter on the optical cavity tuned to pass red light, a green color filter on the optical cavity tuned to pass green light, and a blue color filter on the optical cavity tuned to pass blue light.

19. The electroluminescent device of claim 13, wherein the optical spacer forms at least a portion of an optical cavity tuned to effect emission of one color of light of red, green and blue light.

20. An electroluminescent device comprising:
a substrate;
an electroluminescent element on the substrate, wherein the electroluminescent element comprises a first electrode; a second electrode; and at least a portion of a plurality of sub-pixels;
a plurality of optical spacers located on a side of the electroluminescent element opposing the substrate, wherein each optical spacer directly contacts the electroluminescent element;
a plurality of color filters respectively on the optical spacers;
a plurality of partially reflective interfaces respectively between the optical spacers and the color filters located on the side of the electroluminescent element opposing the substrate; and
an encapsulation layer separate from the plurality of optical spacers, and located on a side of the electroluminescent element opposing the substrate, wherein the encapsulation layer is continuous and is located above the first electrode;
wherein in at least two of the sub-pixels, a corresponding one of the optical spacers is between the electroluminescent element and a corresponding one of the partially reflective interfaces to form a top emitting electroluminescent device,
wherein adjacent optical spacers are spaced from each other,
wherein a refractive index of one of the optical spacers is substantially mismatched with a refractive index of an adjacent material to form a respective one of the partially reflective interfaces, and wherein the partially reflective interfaces are at different distances from a surface of the first electrode.

* * * * *